United States Patent
Iijima

(10) Patent No.: US 6,804,151 B2
(45) Date of Patent: Oct. 12, 2004

(54) NONVOLATILE SEMICONDUCTOR MEMORY DEVICE OF VIRTUAL-GROUND MEMORY ARRAY WITH RELIABLE DATA READING

(75) Inventor: Mitsuteru Iijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/437,390

(22) Filed: May 14, 2003

(65) Prior Publication Data

US 2003/0214844 A1 Nov. 20, 2003

(30) Foreign Application Priority Data

May 15, 2002 (JP) ........................................ 2002-140077

(51) Int. Cl.$^7$ ............................................ G11C 11/34
(52) U.S. Cl. ................................ 365/185.21; 365/185.2
(58) Field of Search ........................... 365/185.21, 185.2

(56) References Cited

U.S. PATENT DOCUMENTS 6,292,395 B1 * 9/2001 Lin .......................... 365/185.2

* cited by examiner

*Primary Examiner*—M. Tran
(74) *Attorney, Agent, or Firm*—Arent Fox, PLLC.

(57) ABSTRACT

A nonvolatile semiconductor memory device includes a virtual-ground memory array which includes a plurality of word lines and a plurality of bit lines, a row decoder which selectively activates one of the word lines, a column decoder which applies a sense potential to one of the bit lines, and couples all the remaining ones of the bit lines to a ground potential, and a sense amplifier which compares an electric current running through the one of the bit lines with a first reference current and a second reference current so as to sense a data state of two memory cells that are connected to the one of the word lines and share the one of the bit lines, the sensed data state including a first state in which both of the two memory cells are "0", a second state in which both of the two memory cells are "1", and a third state in which one of the two memory cells is "1" and another of the two memory cells is "0".

6 Claims, 7 Drawing Sheets

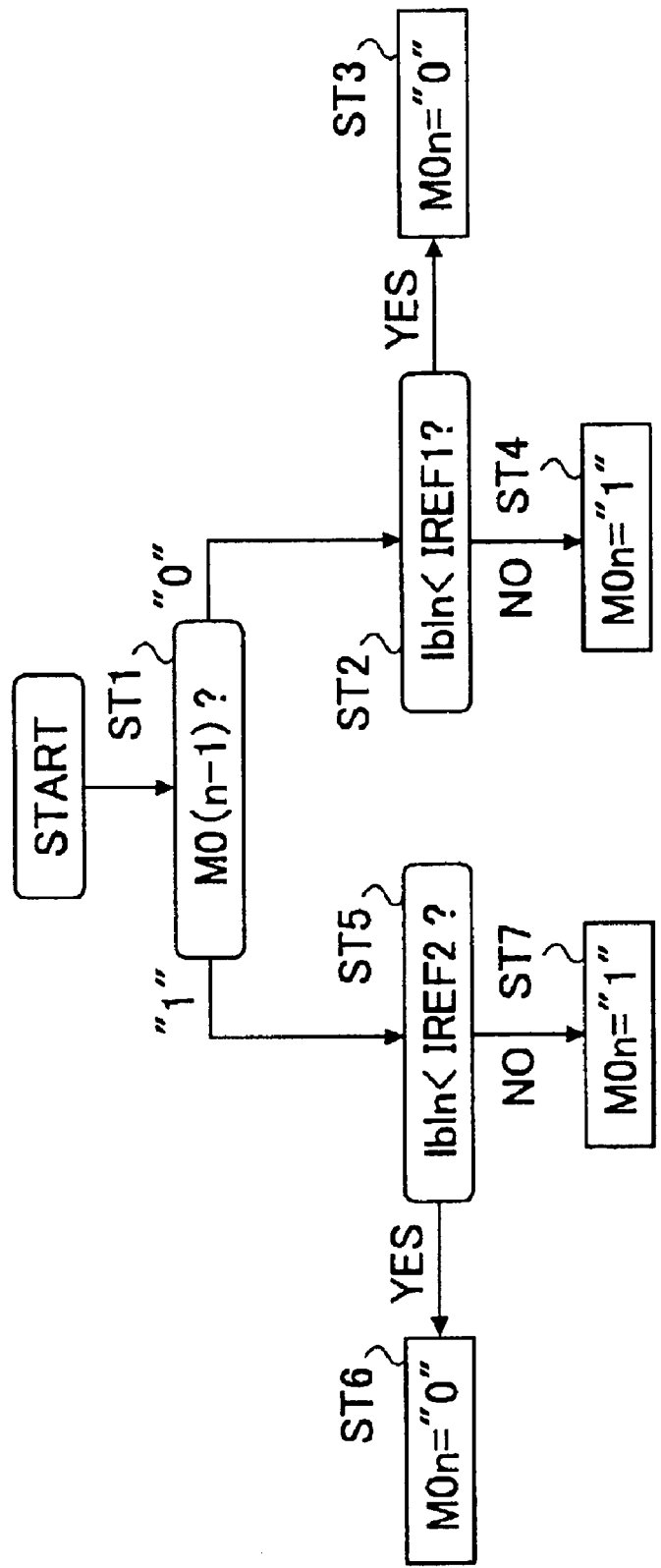

NONVOLATILE SEMICONDUCTOR MEMORY DEVICE OF VIRTUAL-GROUND MEMORY ARRAY WITH RELIABLE DATA READING

CROSS-REFERENCE TO RELATED APPLICATIONS

The present application is based upon and claims the benefit of priority from prior Japanese Patent Application No. 2002-140077 filed on May 15, 2002, with the Japanese Patent Office, the entire contents of which are incorporated herein by reference.

BACKGROUND OF THE INVENTION

1. Field of the Invention

The present invention generally relates to nonvolatile semiconductor memory devices, and particularly relates to a nonvolatile semiconductor memory device having a virtual-ground memory array.

2. Description of the Related Art

In the virtual-ground memory array, bit lines are formed of diffusion layers. Among the diffusion layers corresponding to a pair of bit lines, the one that is coupled to the ground potential functions as a source, and the other that is coupled to the power supply potential serves as a drain. In such a virtual-ground memory array, the bit-line diffusion layers of a memory cell are shared by adjacent memory cells that are situated alongside in the direction of word-line extension. Because of this, the drain contact that is normally provided for each memory cell in the NOR-type memory cell array is not necessary, thereby achieving size reduction of memory cells.

FIG. 1 is a circuit diagram showing a portion of a virtual-ground memory array.

The virtual-ground memory array of FIG. 1 includes memory cells M00 through M23, bit lines BL0 through BL4, and word lines WL0 through WL2. When data is to be read from the memory cell M02, the word line WL0 is set to a predetermined potential to select all the memory cells connected to the word line WL. Further, the bit lines BL0 through BL2 are set to a drain potential of 1V, for example, and the bit lines BL3 and BL4 are coupled to the ground potential. With these settings, the bit line BL2 serves as a drain, and the bit line BL3 functions as a source with respect to the memory cell M02. As shown in FIG. 1, an electric current Im02 flowing through the memory cell M02 is equal to an electric current Ibl2 running through the bit line BL2. The data of the memory cell M02 is detected by sensing the electric current Ibl2 by use of a sense amplifier (not shown).

In such read operation, the reason why the bit line BL1 is set to 1V to equalize the bit lines BL1 and BL2 is that there is a need to prevent a leak current from running from the bit line BL2 to the bit line BL1 through the memory cell M01. Under the presence of such a leak current, the electric current Im02 running through the memory cell M02 would be different from the electric current Ibl2 flowing through the bit line BL2, so that the detection of the current Ibl2 may not result in the correct data of the memory cell being obtained.

In the configuration that prevents a leak current as described above, the potential that is applied to the adjacent bit line BL1 is referred to as a precharge potential, and the potential that is applied to the read bit line BL2 is referred to as a sense potential.

Since the bit lines of a virtual-ground memory array are formed of impurity diffusion layers, the resistance of the bit lines is relatively large, compared to the NOR-type nonvolatile memories in which bit lines are provided as hard-wires formed of a low-resistance metal. A potential drop is thus likely to occur along the bit lines. As a result, the sense potential and the precharge potential may not be set to the same voltage as desired.

A typical construction is such that the sense potential and the precharge potential are supplied from separate circuits, which may result in the supply timing being different between the sense potential and the precharge potential. In such a case, the sense potential and the precharge potential may not exhibit the same voltage level.

When the data of the memory cell M02 shown in FIG. 1 is to be detected, almost no leak current flows through the memory cell M01 if the threshold potential of the adjacent memory cell M01 is high due to the data status of "0" of the memory cell M01. This is the case even when there is a difference between the precharge potential and the sense potential. If the threshold potential of the memory cell M01 is low due to the data status of "1" thereof, however, a difference between the precharge potential and the sense potential will affect the read operation.

Further, it is possible that the threshold of a memory cell may be erroneously sensed due to the effect of a leak current during program-verify operations or erase-verify operations. In such a case, the reliability of verify operations may suffer greatly. This results in the threshold potential of data "0" and data "1" having increased variation between different memory cells, which reduces a margin for threshold fluctuation caused by a thermally induced stress or the like. As a result, the reliability of the nonvolatile memory is lowered.

Accordingly, there is a need for a nonvolatile semiconductor memory device which allows data to be correctly sensed even if a leak current exists in the virtual-ground memory array.

SUMMARY OF THE INVENTION

It is a general object of the present invention to provide a nonvolatile semiconductor memory device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device, including a virtual-ground memory array which includes a plurality of word lines and a plurality of bit lines, a row decoder which selectively activates one of the word lines, a column decoder which applies a sense potential to one of the bit lines, and couples all the remaining ones of the bit lines to a ground potential, and a sense amplifier which compares an electric current running through the one of the bit lines with a first reference current and a second reference current so as to sense a data state of two memory cells that are connected to the one of the word lines and share the one of the bit lines, the sensed data state including a first state in which both of the two memory cells are "0", a second state in which both of the two memory cells are "1", and a third state in which one of the two memory cells is "1" and another of the two memory cells is "0".

In the nonvolatile semiconductor memory device as described above, a memory cell that acts as a current leaking path in the conventional art is included as an object of data sensing, so that the two memory cells sharing the sensed bit line are both treated as objects of data sensing. The electric current flowing through this bit line is compared with the two different reference currents, thereby sensing the lump-sum data state of the two memory cells. Since all the bit lines other than the sensed bit line are coupled to the ground potential at the time of data sensing, a precharge operation of bit lines that are necessary in the conventional art is no longer required. Further, the ground potential is extremely stable in comparison with the precharge potential, and is not susceptible to a potential drop caused by bit-line resistance. Accordingly, the present invention can completely eliminate erroneous reading of data that occurs in the conventional art due to an unstable potential difference between the sensed bit line and the precharged bit lines.

Other objects and further features of the present invention will be apparent from the following detailed description when read in conjunction with the accompanying drawings.

BRIEF DESCRIPTION OF THE DRAWINGS

FIG. 7 is a flowchart of the data sensing operation according to the second embodiment.

DESCRIPTION OF THE PREFERRED EMBODIMENTS

In the following, embodiments of the present invention will be described with reference to the accompanying drawings.

Figure 1:
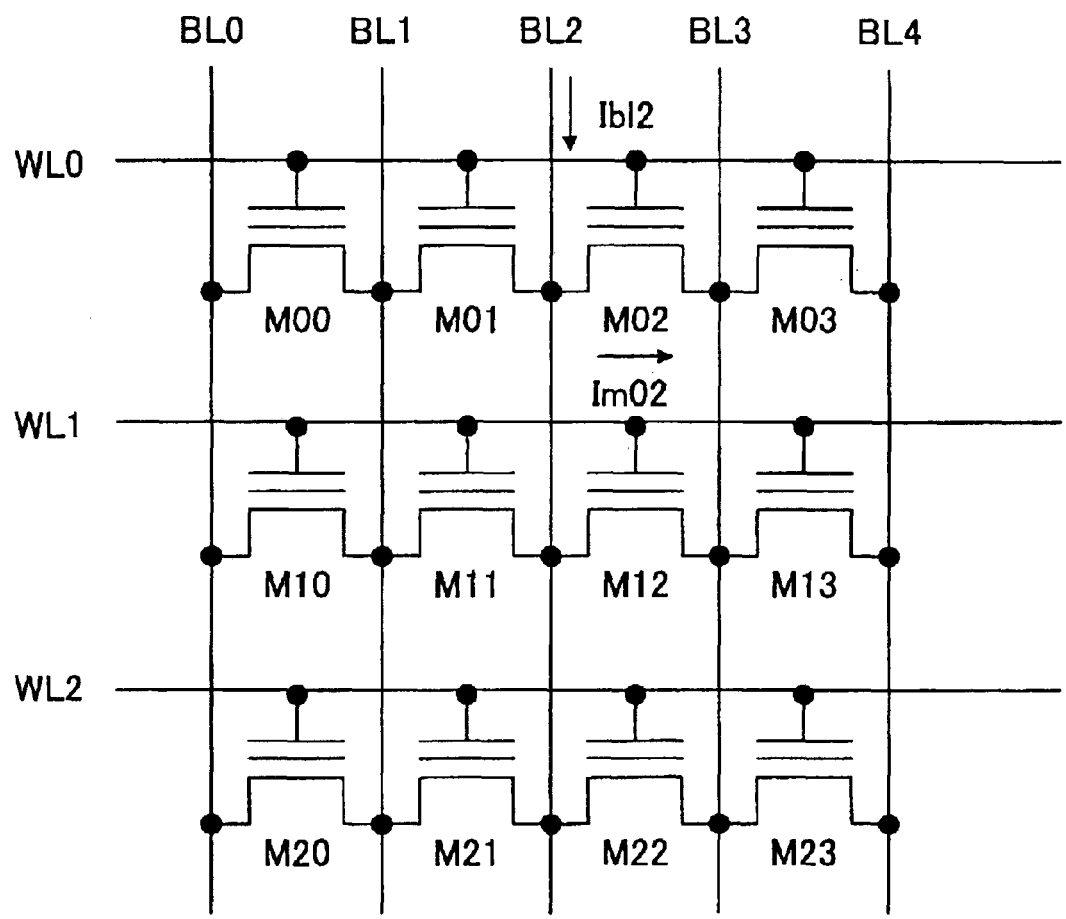
FIG. 1 is a circuit diagram showing a portion of a virtual-ground memory array.
Figure 2:
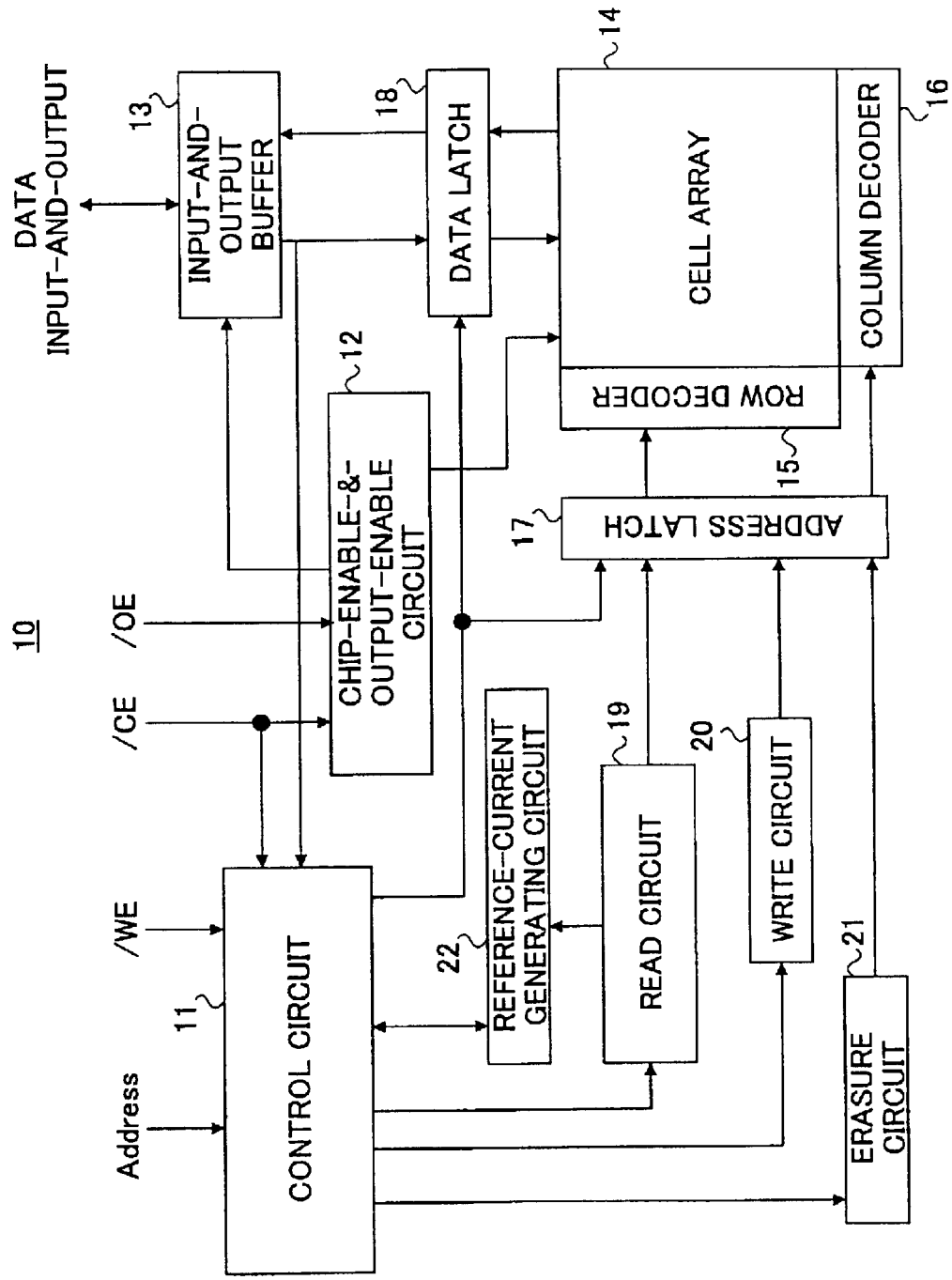
FIG. 2 is a block diagram of a nonvolatile semiconductor memory device according to the present invention.

FIG. 2 is a block diagram of a nonvolatile semiconductor memory device according to the present invention.

A nonvolatile semiconductor memory device 10 of FIG. 2 includes a control circuit 11, a chip-enable-&-output-enable circuit 12, an input-and-output buffer 13, a cell array 14, a row decoder 15, a column decoder 16, an address latch 17, a data latch 18, a read circuit 19, a write circuit 20, an erasure circuit 21, and a reference-current generating circuit 22.

The control circuit 11 receives address signals, data signals, and control signals such as a write-enable signal /WE and a chip-enable signal /CE from the exterior, and operates as a state machine based on these signals, thereby controlling the operation of each unit of the nonvolatile semiconductor memory device 10. The input-and-output buffer 13 receives data from the exterior, and supplies the data to the control circuit 11 and the data latch 18. The chip-enable-&-output-enable circuit 12 receives the chip-enable signal /CE and an output-enable signal /OE as control signals from the exterior of the device, and controls the input-and-output buffer 13 and the cell array 14 as to whether they are activated.

The read circuit 19 operates under the control of the control circuit 11, and controls the cell array 14, the row decoder 15, the column decoder 16, etc., through the address latch 17 in order to read data from the specified address in the cell array 14. The write circuit 20 operates under the control of the control circuit 11, and controls the cell array 14, the row decoder 15, the column decoder 16, etc., through the address latch 17 in order to write data at the specified address in the cell array 14. Moreover, the erasure circuit 21 operates under the control of the control circuit 11, and controls the cell array 14, the row decoder 15, the column decoder 16, etc., through the address latch 17 in order to erase a specified unit area of the cell array 14 at once by a unit-by-unit basis.

The cell array 16 is a virtual-ground memory array, and includes an array of memory cell transistors, word lines, bit lines, etc., to store data in each memory cell transistor. At the time of data-read operation, data of memory cells selected by an activated word line are retrieved to bit lines. At the time of program operation or erase operation, the word lines and the bit lines are set to proper potentials specific to the indicated operation, thereby storing or eliminating electric charge in the memory cells.

The data latch 18 operates under the control of the control circuit 11, and senses the "0/1" state of data by comparing a data current with a reference current as the data is supplied from the cell array 14 according to indications by the row decoder 15 and the column decoder 16. This sensing is carried out by sense amplifier circuits in the data latch 18, and sense results are supplied to the input-and-output buffer 13 as retrieved data.

Moreover, verify operations performed as part of a program operation or an erase operation are carried out by comparing a data current with a program-verify-purpose reference current or an erase-verify-purpose reference current as the data is supplied from the cell array 14 according to indications by the row decoder 15 and the column decoder 16. The reference-current generating circuit 22 generates the reference currents that are used for these data sensing operations. The data latch 18 latches data that is input through the input-and-output buffer 13 from the exterior during a data write operation, and makes the data available for storage in the cell array 14.

In the present invention, the reference-current generating circuit 22 generates a first reference current and a second reference current (the second reference current>the first reference current), and the data latch 18 compares a data current with these two reference currents in order to achieve accurate data sensing despite the presence of a leak current.

Figure 3:
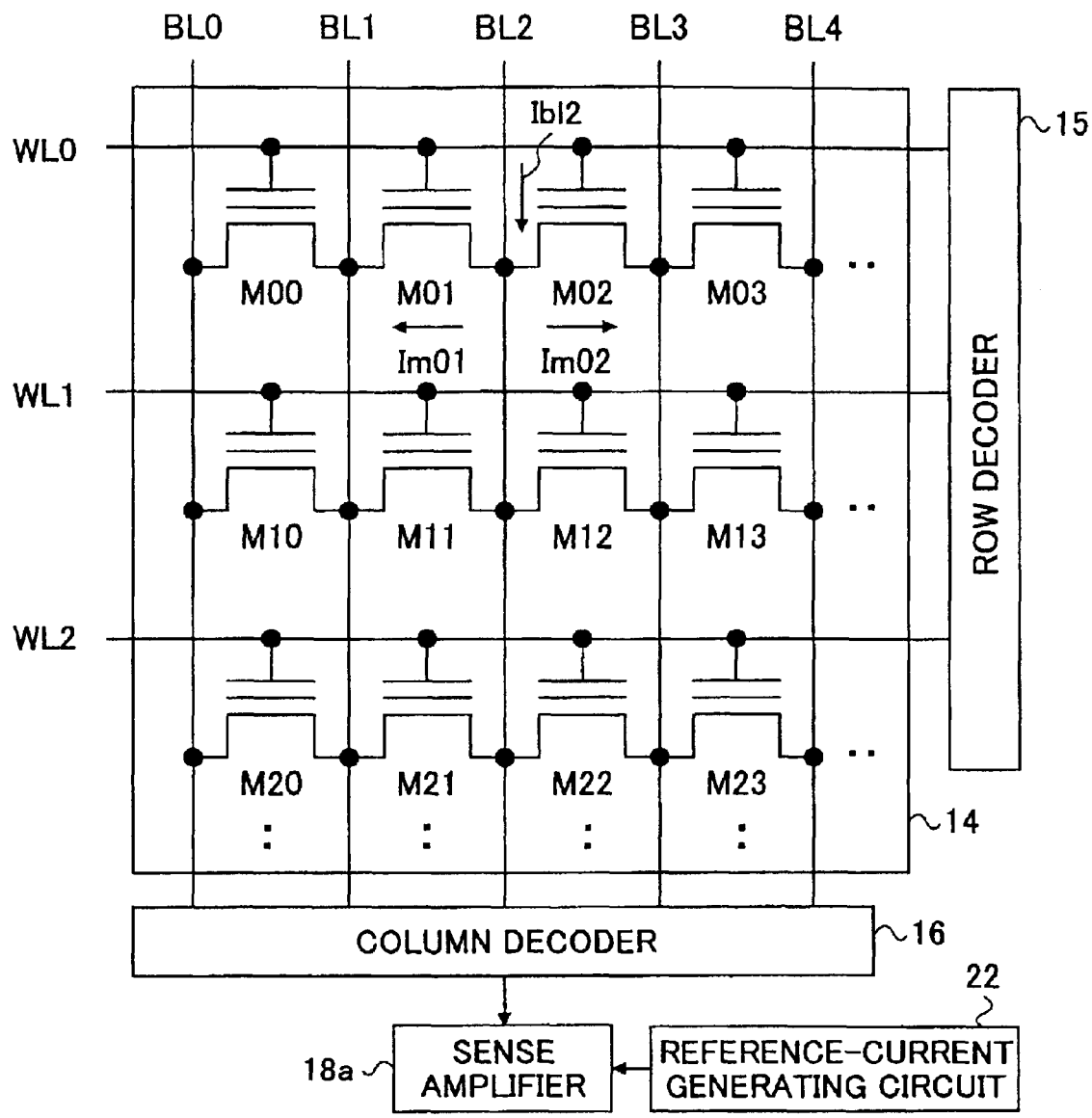
FIG. 3 is an illustrative drawing for explaining a data sensing operation according to a first embodiment of the present invention.

FIG. 3 is an illustrative drawing for explaining a data sensing operation according to a first embodiment of the present invention.

The cell array 14 is a virtual-ground memory array, and includes memory cells M00 through M23, bit liens BL0 through BL4, and word lines WL0 through WL2. The bit lines BL0 through BL4 are connected to the column decoder 16, and the word lines WL0 through WL2 are connected to the row decoder 15. The column decoder 16 controls the potential of the bit lines BL0 through BL4, and the row decoder 15 controls the potential of the word lines WL0 through WL2. A sense amplifier 18a is provided in the data latch 18 shown in FIG. 2, and carries out a data sensing operation by comparing a data current with the reference currents supplied from the reference-current generating circuit 22. Here, the data current is supplied from the cell array 14 according to indications given by the row decoder 15 and the column decoder 16.

When the data of the memory cell M02 is to be read in FIG. 3, the word line WL0 is set to a predetermined voltage (e.g., 2V) so as to select all the memory cells connected to the word line WL0. Further, the bit line BL2 is coupled to a drain potential such as 1V, with all the other bit lines BL0, BL1, BL3, and BL4 being coupled to the ground potential. In this case, as shown in FIG. 3, the memory cell M02 and the adjacent memory cell M01 have an electric current Im02 and an electric current Im01 running therethrough, respectively. The current Ibl2 that flows through the bit line BL2 is a sum of the electric current Im02 and the electric current Im01.

The sense amplifier 18a compares the current Ibl2 with a first reference current IREF1. A pair of data pieces stored in the pair of memory cells M01/M02 is sensed as "0/0" if the current Ibl2 is smaller than the first reference current IREF1. That is, both of the memory cells M01 and M02 are sensed as the "0" state (i.e., programmed state).

If the current Ibl2 is larger than the first reference current IREF1, the sense amplifier 18a compares the current Ibl2 with a second reference current IREF2. If the current Ibl2 is larger than the second reference current IREF2, the data pieces stored in the pair of memory cells M01/M02 are sensed as "1/1". That is, both of the memory cells M01 and M02 are sensed as the "1" state (i.e., erased state). If the current Ibl2 is smaller than the second reference current IREF2, the data pieces stored in the pair of memory cells M01/M02 are sensed as "1/0" or "0/1". That is, the memory cells M01 and M02 are sensed as having the "1" state in one cell and the "0" state in the other cell.

In this manner, the current of the bit line to be sensed is compared with the two types of reference currents, so that a pair of data pieces are simultaneously sensed with respect to a pair of memory cells that share this bit line and are adjacent to each other in the direction of word-line extension. This results in the determination of either the "0/0" state, the "1/1" state, or the "1/0 or 0/1" state.

Figure 4:
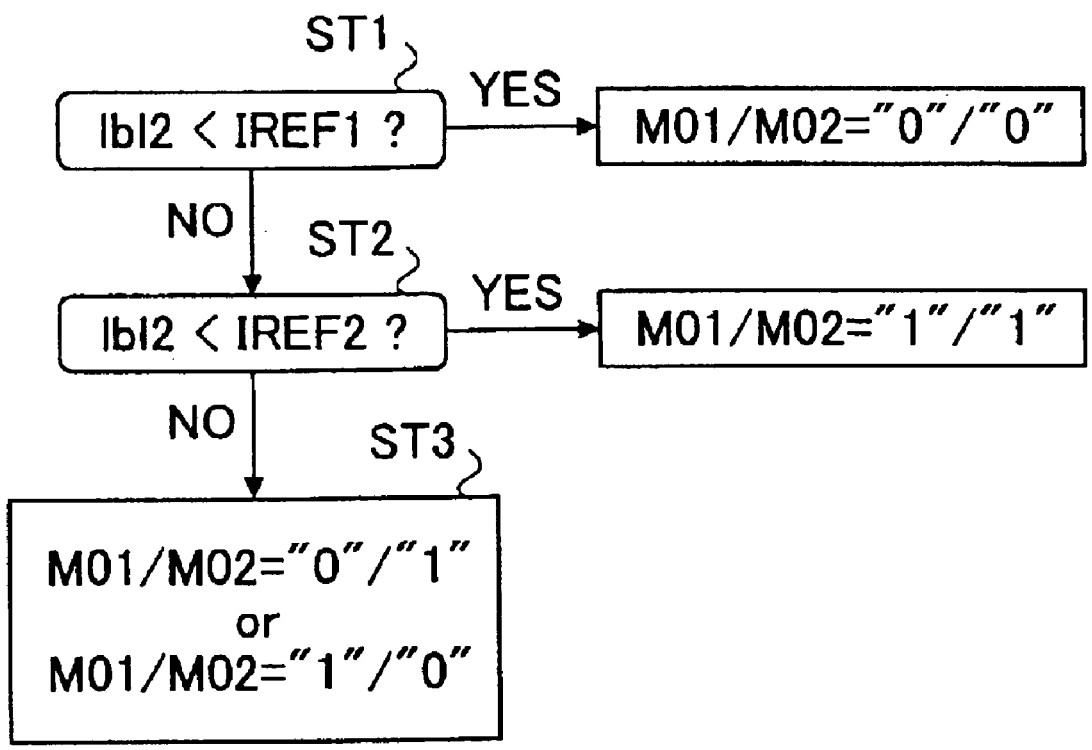
FIG. 4 is a flowchart of the data sensing operation according to the first embodiment.

FIG. 4 is a flowchart of the data sensing operation according to the first embodiment.

At a step ST1, a check is made as to whether the current Ibl2 is smaller than the first reference current IREF1. If it is smaller, the pair of memory cells M01/M02 is sensed as "0/0". Otherwise, the procedure goes to a step ST2.

At the step ST2, a check is made as to whether the current Ibl2 is larger than the second reference current IREF2. If it is larger, the pair of memory cells M01/M02 is sensed as "1/1". Otherwise, the procedure goes to a step ST3.

At the step ST3, the pair of memory cells M01/M02 are determined as either "1/0" or "0/1".

In the data sensing method according to this embodiment, a data state of each memory cell can be identified if the data state is either "0/0" or "1/1". If the data state is the "1/0 or 0/1" sate, however, it cannot be determined as to which one of the two memory cells is "1" and which one of the two memory cells is "0". This data sensing method, nonetheless, makes it possible to effectively check whether all the bits in the cell array are programmed or all the bits in the cell array are erased.

If a sense potential is applied to every other bit line BL0, BL2, BL4, and the ground potential is applied to all the other bit lines, data of memory cell pairs can be successively sensed. Since all the bit lines other than the sensed bit line are coupled to the ground potential at the time of data sensing, a precharge operation of bit lines that are necessary in conventional operations is no longer required. Further, the ground potential is extremely stable in comparison with the precharge potential, and is not susceptible to a potential drop caused by bit-line resistance. Accordingly, the present invention can completely eliminate erroneous reading of data that occurs in the conventional operations due to an unstable potential difference between the sensed bit line and the precharged bit lines.

The ability to identify whether data bits are all in the "0" state or all in the "1" state in an efficient and reliable manner is particularly useful when erasing data of a memory cell array at once by the unit of one chip or by the unit of one block.

In the lump erasure of a flash memory, if a memory cell is overly erased to be in a depletion state, a column leak occurs whereby a leak current flows even when there is no potential difference between adjacent bit lines. This results in correct data sensing of memory-cell data being prevented. In order to avoid such over-erasure, all the memory cells to be erased are typically set in the programmed state prior to the erasure operation. That is, all the memory cells are programmed so as to reduce variation of threshold values prior to an erasure operation, so that threshold values of the memory cells after the erasure operation also have small variation, which helps to avoid over-erasure. In the flash memories, therefore, all the bits are set to the "0" state in response to a lump-erasure command, followed by setting these bits in the "1" state.

According to the embodiment described above, determination as to whether all the bits are "0" and as to whether all the bits are "1" can be reliably and quickly made when a lump-erasure command is entered, for example.

A nitride film may be employed as a charge capture layer in the virtual-ground memory array, thereby making it possible to store 2-bit data in a single memory cell transistor. In such a nonvolatile semiconductor memory device, two ends of a nitride film situated between the bit lines are treated as two separate memory cells, with 2-bit data being stored depending on whether hot electrons are injected into the respective cells. This is made possible by utilizing a property that electric charge does not move in the charge-capture layer of the nitride film.

In the flash memory of this type, a film composed of an oxide film, a nitride film, and an oxide film is formed between the control gate and the substrate, and electric charge trapped in the nitride film serves to control the threshold value, thereby discriminating "0" and "1". In this case, the trap layer made of the nitride film is an insolating film, so that electric charge does not move. This makes it possible to store 2-bit data in a single cell by storing electric charge separately at the opposite ends of the trap layer. The 2-bit data can be separately read by swapping the drain and the source over in the data-read operation.

Writing to a memory cell is carried out by injecting channel hot electrons. Potentials of 12V, 8V, and 0V, for example, are applied to the gate electrode, the drain node, and the source and substrate, respectively, thereby trapping hot electrons in the nitride film as they are generated in the channel. The hot electrons are injected to a portion of the nitride film close to the drain node. Erasure operation is carried out by hot-hole injection. Potentials of −6V and 5V, for example, are applied to the gate electrode and the drain node, respectively, thereby injecting holes in the nitride film as they are generated by a inter-band tunnel current running from the drain to the substrate. These holes neutralize and purge the electric charge. When the electric charge corresponding to two bits are in existence in a single cell, the same potential as applied to the drain is applied to the source so as to perform an erasure operation. A read operation is carried out by a reverse read method that swaps the drain and the source over relative to the drain and the source of the write operation. Namely, a diffusion layer that is opposite to the diffusion layer used as the drain during the write operation is used as a drain in the data read operation.

An embodiment that will be described in the following is directed to a flash memory that stores 2-bit data in a single memory cell by storing electric charge in a trap layer of a nitride film or the like.

Figure 5:
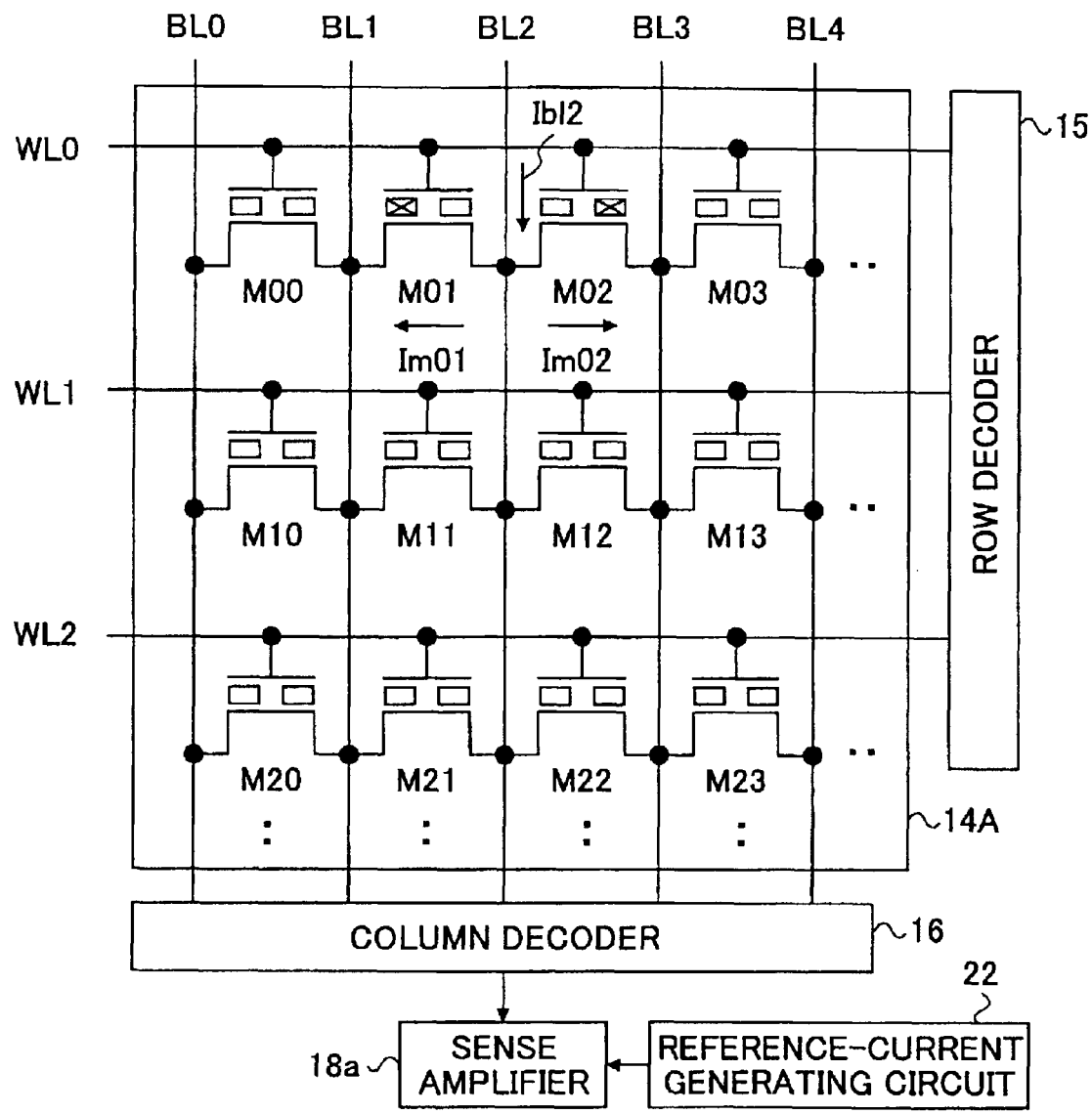
FIG. 5 is an illustrative drawing for explaining a data sensing operation according to a variation of the first embodiment.

FIG. 5 is an illustrative drawing for explaining a data sensing operation according to a variation of the first embodiment. In FIG. 5, the same elements as those of FIG. 3 are referred to by the same numerals, and a description thereof will be omitted.

A cell array 14A is a virtual-ground memory array that stores 2-bit data in a single memory cell, and includes memory cells M00 through M23, bit liens BL0 through BL4, and word lines WL0 through WL2. Two boxes are illustrated to represent the positions of two bits in order to indicate that 2-bit data can be stored in each memory cell.

When the right-hand-side bit (shown by "x" in the box) of the memory cell M02 and the left-hand-side bit (shown by "x" in the box) of the memory cell M01 are to be read, the word line WL0 is set to a predetermined voltage (e.g., 2V). Further, the bit line BL2 is coupled to a drain potential such as 1V, with all the other bit lines BL0, BL1, BL3, and BL4 being coupled to the ground potential. In this case, as shown in FIG. 5, the memory cell M02 and the adjacent memory cell M01 have an electric current Im02 and an electric current Im01 running therethrough, respectively. The current Ibl2 that flows through the bit line BL2 is a sum of the electric current Im02 and the electric current Im01.

The sense amplifier 18a compares the current Ibl2 with a first reference current IREF1. A pair of data pieces stored in the M01-left-hand-side bit and the M02-right-hand-side bit is sensed as "0/0" if the current Ibl2 is smaller than the first reference current IREF1. If the current Ibl2 is larger than the first reference current IREF1, the sense amplifier 18a compares the current Ibl2 with a second reference current IREF2. If the current Ibl2 is larger than the second reference current IREF2, the data pieces stored in the M01-left-hand-side bit and the M02-right-hand-side bit are sensed as "1/1". If the current Ibl2 is larger than the first reference current IREF1 and smaller than the second reference current IREF2, the data pieces stored in the M01-left-hand-side bit and the M02-right-hand-side bit are sensed as "1/0" or "0/1".

The sensing operation described above is the same as that of the first embodiment. The way the sense potential is applied for data sensing of each memory cell, however, is different from the first embodiment. Since each memory cell stores 2-bit data, the sense potential is successively applied to every one of the bit lines, rather than being applied to every other bit line as in the first embodiment. This achieves data sensing with respect to both the right-hand-side bit and the left-hand-side bit of each memory cell.

In the following, a data sensing method according to a second embodiment will be described.

The data sensing method according to the second embodiment is directed to sensing data stored in each memory cell when data "0" and data "1" are both present in the floating-gate-type nonvolatile memory (FIG. 3) that stores one-bit data in each memory cell.

Figure 6A:
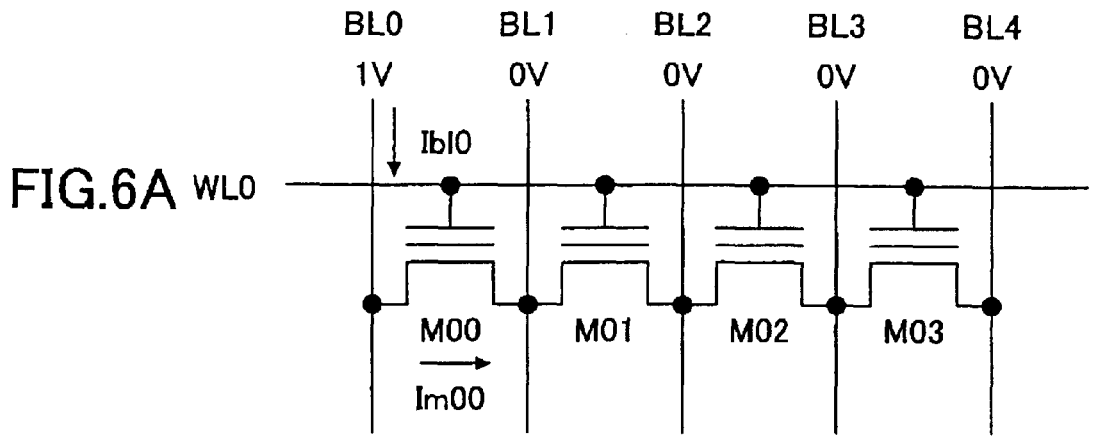
FIGS. 6A through 6C are illustrative drawings for explaining a data sensing method of a second embodiment according to the present invention.
Figure 6B:
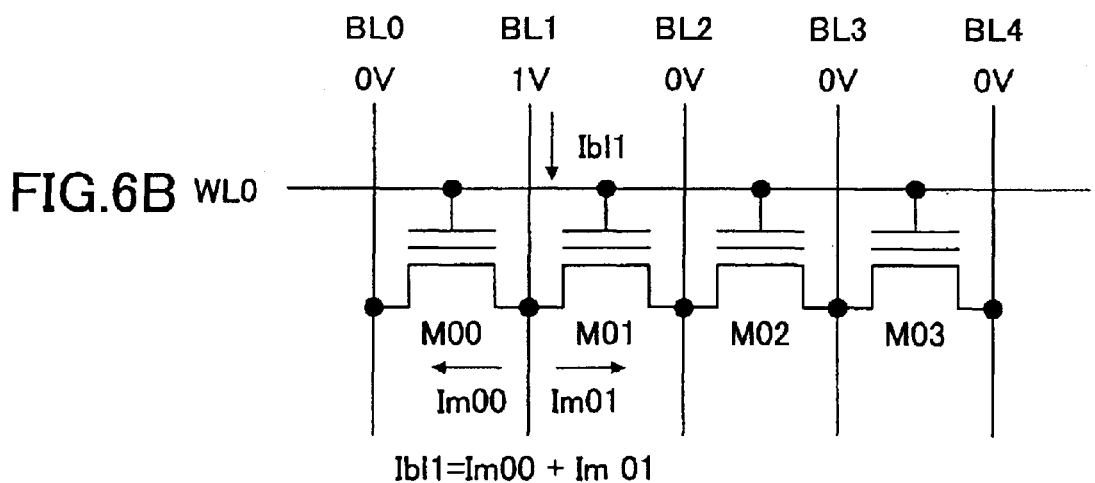
Figure 6C:
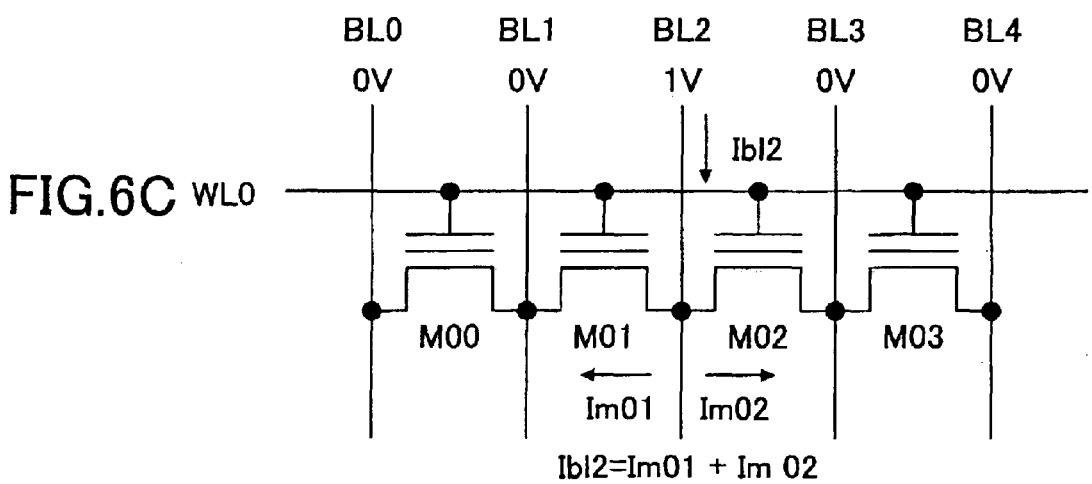

FIGS. 6A through 6C are illustrative drawings for explaining the data sensing method of the second embodiment according to the present invention. FIGS. 6A through 6C show a memory-cell portion that is connected to the word line WL0, wherein only this portion of the cell array 14 shown in FIG. 3 is illustrated here for the sake of convenience of explanation.

As shown in FIG. 6A, the word line WL0 is set to a predetermined potential (e.g., 2V), and the bit line BL0 situated at the end of the memory-cell block is set to a sense potential (e.g., 1V), with all the other bit lines being coupled to the ground potential. Under these conditions, the electric current Ibl0 flowing through the bit line BL0 is compared with the first reference current IREF1. The memory cell M00 is identified as being "0" if the current Ibl0 is smaller than the first reference current IREF1, and is identified as being "1" if the current Ibl0 is larger than the first reference current IREF1.

The outcome of data sensing of the memory cell M00 is stored in internal data resisters by the control circuit 11 shown in FIG. 2, for example, and will be used for subsequent data sensing of the next memory cell M01.

Following this, as shown in FIG. 6B, the word line WL0 is set to a predetermined potential (e.g., 2V), and the bit line BL1 that is next to the previously sensed bit line is set to the sense potential (e.g., 1V), with all the other bit lines being coupled to the ground potential. The memory cells M00 and M01 have electric currents Im00 and Im01 running through them, respectively. Under these conditions, the electric current Ibl1 flowing through the bit line BL1 is a sum of the current Im00 and the current Im01.

If the data of the memory cell M00 that is previously sensed is "0", the current Ibl1 is compared with the first reference current IREF1. The memory cell M01 is identified as being "0" if the current Ibl1 is smaller than the first reference current IREF1, and is identified as being "1" if the current Ibl1 is larger than the first reference current IREF1.

If the data of the memory cell M00 that is previously sensed is "1", the current Ibl1 is compared with the second reference current IREF2. The memory cell M01 is identified as being "0" if the current Ibl1 is smaller than the second reference current IREF2, and is identified as being "1" if the current Ibl1 is larger than the second reference current IREF2.

The outcome of data sensing of the memory cell M01 is stored in internal data resisters by the control circuit 11 shown in FIG. 2, for example, and will be used for subsequent data sensing of the next memory cell M02.

Following this, as shown in FIG. 6C, the word line WL0 is set to a predetermined potential (e.g., 2V), and the bit line BL2 that is next to the previously sensed bit line is set to the sense potential (e.g., 1V), with all the other bit lines being coupled to the ground potential. The memory cells M01 and M02 have electric currents Im01 and Im02 running through them, respectively. Under these conditions, the electric current Ibl2 flowing through the bit line BL2 is a sum of the current Im01 and the current Im02.

After this, the data sensing of the memory cell M02 can be carried out based on the sensed data of the memory cell M01 in the same manner as the data sensing of the memory cell M01 was carried out based on the sensed data of the memory cell M00.

FIG. 7 is a flowchart of the data sensing operation according to the second embodiment. This flowchart shows a procedure for sensing data of the memory cell M0n based on the data status of the previously sensed memory cell M0(n−1).

At step ST1, a check is made as to whether the preceding memory cell M0(n−1) was "0" or "1". If it was "0", an electric current Ibln is compared with the first reference current IREF1 at step ST2. If the current Ibln is smaller than the first reference current IREF1, the memory cell M0n is sensed as "0" at step ST3. If the current Ibln is larger than the first reference current IREF1, the memory cell M0n is sensed as "1" at step ST4.

If the data of the previously sensed memory cell M0(n−1) was "1", the electric current Ibln is compared with the second reference current IREF2 at step ST5. If the current Ibln is smaller than the second reference current IREF2, the memory cell M0n is sensed as "0" at step ST6. If the current Ibln is larger than the second reference current IREF2, the memory cell M0n is sensed as "1" at step ST7.

In this manner, the data status of each memory cell can be successively identified by starting from the end of the memory block. This makes it possible to sense the data of each memory cell even when "0" data and "1" data are both present.

In the following, a description will be given of a case in which the present invention is applied to data sensing performed as a write verify operation or an erase verity operation.

If it is desired to change a pair of memory cells M01/M02 from "1/1" to "0/1", the following procedure will be performed.

The word line WL0 is set to 12V, for example. Then, the bit lines BL0 and BL1 are coupled to the ground potential, and the bit lines BL2, BL3, BL4, . . . are set to 8V. This achieves data writing by injecting electrons into the floating gate of the memory cell M01 through hot-electron injection.

After this, the word line WL0 is set to 1V, and the bit line BL2 is set to 1V, with the other bit lines being coupled to the ground potential. The electric current Ibl2 (=IM01+IM02) that flows through the bit line BL2 is then sensed. In this case, it is already known that the data of the memory cell M02, i.e., the other cell of the memory cell pair, is "1", so that it suffices to check whether Ibl2<IREF2. If Ibl2<IREF2, M01/M02 is identified as "0/1", and the write operation and the write verify operation come to an end. If the condition "Ibl2<IREF2" is not satisfied, the write operation and the write verify operation as described above will be repeated until the condition "Ibl2<IREF2" is satisfied.

If it is desired to change the pair of memory cells M01/M02 from "0/1" to "0/0", the following procedure will be performed.

The word line WL0 is set to 10V, for example. Then, the bit lines BL0, BL1, and BL2 are coupled to the ground potential, and the bit lines BL3, BL4, . . . are set to 5V. This achieves data writing by injecting electrons into the floating gate of the memory cell M02 through hot-electron injection.

After this, the word line WL0 is set to 1V, and the bit line BL2 is set to 1V, with the other bit lines being coupled to the ground potential. The electric current Ibl2 (=IM01+IM02) that flows through the bit line BL2 is then sensed. In this case, it is already known that the data of the memory cell M02, i.e., the other cell of the memory cell pair, is "0", so that it suffices to check whether Ibl2<IREF1. If Ibl2<IREF1, M01/M02 is identified as "0/0", and the write operation and the write verify operation come to an end. If the condition "Ibl2<IREF1" is not satisfied, the write operation and the write verify operation as described above will be repeated until the condition "Ibl2<IREF1" is satisfied.

If it is desired to change the pair of memory cells M01/M02 from "0/0" to "1/1", the following procedure will be performed.

The word line WL0 is set to −5V, and the bit line BL2 is set to 5V, with all the other bit lines coupled to the ground potential or left at a floating potential. This achieves data erasure by draining electrons from the floating gates of the memory cells M01 and M02 to a BL2 impurity diffusion layer through the FN tunneling method.

After this, the word line WL0 is set to 1V, and the bit line BL2 is set to 1V, with the other bit lines coupled to the ground potential. The electric current Ibl2 (=IM01+IM02) that flows through the bit line BL2 is then sensed. In this case, both memory cells forming a pair are in the erased state, so that it suffices to check whether Ibl2>IREF2. If Ibl2>IREF2, M01/M02 is identified as "1/1", and the erase operation and the erase verify operation come to an end. If the condition "Ibl2>IREF2" is not satisfied, the erase operation and the erase verify operation as described above will be repeated until the condition "Ibl2>IREF2" is satisfied.

If it is desired to change the pair of memory cells M01/M02 from "0/1" to "1/1", the following procedure will be performed.

In this case, pre-programming is necessary in order to avoid over-erasure. A write operation and a write verify operation are thus performed on the memory cell M02, thereby changing M01/02 from the "0/1" state to the "0/0" state. Thereafter, the erase operation and the erase verify operation as described above are carried out to change the "0/0" state to the "1/1" state.

The above embodiment has been described with reference to a case in which the first and second reference currents are constant regardless of whether it is the read operation, the write verify operation, or the erase verify operation. These reference currents, however, do not have to be constant. For example, reference currents dedicated for use in the write verify operation or dedicated for use in the erase verify operation may be provided.

Further, the present invention is not limited to these embodiments, but various variations and modifications may be made without departing from the scope of the present invention.

What is claimed is:

1. A nonvolatile semiconductor memory device, comprising:
   a virtual-ground memory array which includes a plurality of word lines and a plurality of bit lines;
   a row decoder which selectively activates one of said word lines;
   a column decoder which applies a sense potential to one of said bit lines, and couples all the remaining ones of said bit lines to a ground potential; and
   a sense amplifier which compares an electric current running through said one of said bit lines with a first reference current and a second reference current so as to sense a data state of two memory cells that are connected to said one of said word lines and share said one of said bit lines, the sensed data state including a first state in which both of the two memory cells are "0", a second state in which both of the two memory cells are "1", and a third state in which one of the two memory cells is "1" and another of the two memory cells is "0".

2. The nonvolatile semiconductor memory device as claimed in claim 1, further comprising a control circuit which controls said row decoder, said column decoder, and said sense amplifier.

3. The nonvolatile semiconductor memory device as claimed in claim 2, wherein said control circuit identifies a data state of a first one of the two memory cells based on a known data state of a second one of the two memory cells if the data state of the two memory cells is said third state and if a data state of the second one of the two memory cells is known.

4. A method of sensing data in a nonvolatile semiconductor memory device, comprising the steps of:
  selectively activating one of word lines in a virtual-ground memory array which includes the word lines and a plurality of bit lines;
  applying a sense potential to one of said bit lines and coupling all the remaining ones of said bit lines to a ground potential;
  comparing an electric current running through said one of said bit lines with a first reference current and a second reference current so as to sense a data state of two memory cells that are connected to said one of said word lines and share said one of said bit lines, the sensed data state including a first state in which both of the two memory cells are "0", a second state in which both of the two memory cells are "1", and a third state in which one of the two memory cells is "1" and another of the two memory cells is "0".

5. A method of sensing data in a nonvolatile semiconductor memory device, comprising the steps of:
  selectively activating one of word lines in a virtual-ground memory array which includes the word lines and a plurality of bit lines;
  applying a sense potential to a first bit line in a row of said bit lines and coupling all the remaining ones of said bit lines to a ground potential;
  comparing an electric current running through said first bit line with a first reference current;
  sensing a data state of a first memory cell in response to said comparing wherein said first memory cell is a first one in a row of memory cells connected to said one of said word lines and is connected to said first bit line;
  comparing an electric current running through an n-th one of said bit lines with a reference current that is selected in response to a data state of a (n−1)-th one of said memory cells, so as to sense a data state of a n-th one of said memory cells, wherein said (n−1)-th one of said memory cells and said n-th one of said memory cells share said n-th one of said bit lines.

6. The method as claimed in claim 5, wherein the reference current compared with the electric current running through said n-th one of said bit lines is said first reference current if the data state of said (n−1)-th one of said memory cells is "0", and is a second reference current larger than said first reference current if the data state of said (n−1)-th one of said memory cells is "1".

* * * * *